(12) United States Patent
Wong (10) Patent No.: US 6,285,189 B1
(45) Date of Patent: Sep. 4, 2001

(54) MILLIPEDE COILS

(75) Inventor: Wai Ha Wong, San Jose, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/390,066

(22) Filed: Sep. 4, 1999

(51) Int. Cl.$^7$ .............................. A61B 5/055; G01V 3/00
(52) U.S. Cl. .................... 324/318; 324/321; 335/299; 600/422
(58) Field of Search .................... 324/318, 322, 324/306, 307, 309, 320; 600/422; 333/26; 335/299

(56) References Cited

U.S. PATENT DOCUMENTS

| | | | |
|---|---|---|---|
| 4,694,255 | | 9/1987 | Hayes .................................. 324/318 |
| 5,091,708 | * | 2/1992 | Bezjak .................................. 333/26 |
| 5,986,454 | * | 11/1999 | Leifer .................................. 324/318 |
| 6,029,082 | * | 2/1999 | Srinivasan et al. .................. 600/422 |

OTHER PUBLICATIONS

Article by James Tropp, entitled "The Theory of the Bird–Cage Resonator," published in *Journal of Magnetic Resonance* in 1989, in vol. 82, pp. 51–62.

Article by Pascone et al., entitled "Generalized Electrical Analysis of Low–Pass and High–Pass Birdcage Resonators," published in *Magnetic Resonance Imaging* in 1991, in vol. 9, pp. 395–408.

Article by Peter M. Joseph and Dongfeng Lu, entitled "A Technique for Double Resonant Operation of Birdcage Imaging Coils," published in *IEEE TRansactions on Medical Imaging* in Sep. 1989, in vol. 8, No. 3., pp. 286–294.

Article by Hayes et al., entitled "An Efficient, Highly Homogeneous Radiofrequencey Coil for Whole–Body NMR Imaging at 1.5 T," published in *Journal of Magnetic Resonance* in 1985, in vol. 63, pp. 622–628.

Article by Mark C. Leifer, entitled "Resonant Modes of the Birdcage Coil," published in *Journal of Magnetic Resonance* in 1997, in vol. 124, pp. 51–60.

Article by Crozier et al., entitled "Optimized Small–Bore, High–Pass Resonator Designs," published in *Journal of Magnetic Resonance,* Series B, vol. 109, pp. 1–11 (1995).

Article by Frederick E. Terman, Sc.D., entitled "Radio Engineers' Handbook" published by McGraw–Hill Book Company, Inc. (1943), pp. 64–66.

Book by Frederick W. Grover, entitled "Inductance Calculations: Working Formulas and Tables", published by Dover Publications, Inc, New York, in 1962.

MS thesis by C.L. Chin, Bioengineering Program, Pennsylvania State University (1997).

Abstract by Fitzsimmons and Beck, entitled "A Transformer–coupled Double–resonant Birdcage" of SMRM, 9$^{th}$ Annual Meeting, p. 532 (1990).

* cited by examiner

*Primary Examiner*—Christine Oda
*Assistant Examiner*—Tiffany A. Fetzner
(74) *Attorney, Agent, or Firm*—Bella Fishman (57) ABSTRACT

A birdcage coil comprises a number of elements in birdcage geometry wherein the density of elements is such that the contribution to the total inductance from the mutual inductance of said legs exceeds 45% by conventional model calculation. To accommodate the desired density of elements, necessary capacitances are obtained from compact structures such as inter-digitated patterns which may be oriented axially or between elements, or from arrangements of element portions on opposite sides of a cylindrical substrate.

18 Claims, 6 Drawing Sheets

MILLIPEDE COILS

FIELD OF THE INVENTION

The invention is in the field of nuclear magnetic resonance apparatus and pertains particularly to rf coils of the bird cage geometry for the excitation and observation of resonance.

BACKGROUND OF THE INVENTION

In the practice of magnetic resonance phenomena, the application of rf radiation to a sample and the detection of resulting resonant signal is accomplished in a structure surrounding the sample which may be a helical coil, saddle coil, resonant cavity, or a bird cage resonator. The latter structure is the object of the present work, wherein it is desired to obtain resonant frequencies in a bird cage type structure to facilitate studies of diverse chemical constituents and/or spatial distributions of such constituents which may be appropriate to the sample.

A bird cage coil is frequently described as a ladder circuit, which closes on itself, wherein the current flow down the coil is distributed sinusoidally around it. It is often asserted that the bird cage coil is essentially a transmission line. As a tuned rf circuit, it is employed in nuclear magnetic resonance apparatus for either or both of the functions of rf excitation and signal detection.

The bird cage coil differs in essential manner from saddle coils, helices and like structures in that phase shifts between constituent current loops are employed to provide the proper current distribution. For the bird cage coil, there is a requirement that the phase shift be discretely distributed around the circumference of the coil from zero to $2\pi$ (or $2\pi$, where the mode number, k, is an integer). The phase shift of each element is quite frequency dependent and as a consequence, the bird cage coil is tuned at a discrete frequency to achieve the desired phase shift constraint. It is desirable to achieve a quadrature driven bird cage coil in order to maximize power efficiency upon transmission and signal-to-noise ratio during signal reception.

The bird cage coil is particularly well suited to large volume samples as are routinely encountered with apparatus for medical imaging and in vivo analytic spectroscopy. There has evolved a vast literature regarding birdcage coils. The seminal work is due to by Hales et al, J. Mag. Reds., vol. 63, pp. 622–628 (1985); and see, Troppo, J. Mag. Reds., vol. 82, pp.51–62 (1989); Pascone, et al, Mag. Reds. Imaging, vol. 9, pp.395–408 (1991); Joseph and Lug, IEEE Ter. Med. Imaging, vol. 8 pp. 286–294 (1989); Lifer, J. Mag. Reds., vol. 124, pp.51–60 (1997).

The bird cage structure may be regarded as a periodic structure which closes on itself Periodic elements of the structure produce phase shifts which must aggregate to some integer multiple of $2\pi$ when summed over the closed loop. Geometrically, the resonator has cylindrical symmetry and it is desired that the rf current in the axial direction along the periphery of the structure be proportional to $\sin(k\theta)$ and/or $\cos(k\theta)$, where $\theta$ is the azimuthal angle about the cylindrical axis.

Birdcage coils are further delineated as balanced or unbalanced, quadrature phase sensitive/driven, high pass, low pass or band pass, which features may be served in the present invention by extension from prior art, although some of these features are better effectuated in the present invention.

In regard to balanced birdcage structures in the prior art, a balanced bird cage coil is driven (or signal derived) by coupling the signal ground to the midpoint of one (reactive) leg and the signal lead is suitably coupled to one end of the leg. This is described in U.S. Ser. No. 08/768,037.

The prior art includes a birdcage coil having N=4n legs (where n is an integer) operated in balanced quadrature mode by coupling the signal ground of the Q signal to the electrical midpoint of a first leg and the Q signal lead to the annulus proximate to the end of that first leg while the I signal ground is coupled to the electrical midpoint of a second leg and the I signal lead is coupled to the annulus proximate to the end of the second lead, where the first and second legs are relatively phase shifted by $\pi 2$. This prior art is described in U.S. Ser. No. 08/768,037, incorporated herein by reference. Although the number of legs is contemplated as an indefinite integer variable N, the special utility to be derived from a large number of legs is not further disclosed.

It is recognized that a large number of legs may contribute to increased RF magnetic homogeneity because at a field point, the larger number of contributing poles averages the direction and magnitude among the contributing sources to provide for diminished gradient within the space defined by the surrounding poles. See Hales, U.S. Pat. No. 4,694,255.

The utility of birdcage coils for small bore magnet systems has been examined by Cozier, et al, J. Mag. Reds., Series B 109, pp.1–1(1995), who found that the Q of the coil decreased with the increasing number of legs although homogeneity improved as expected. Eight and 12 legged coils were among the coil studied.

As magnet bore dimensions decrease, or as internal complexity of an NMR probe increases, the available space for discrete components, such as chip capacitors, becomes a constraint.

In the prior art, serial leg capacitances for a low pass birdcage coil were obtained in an integral leg construction by Liefer and Hartmann, U.S. Ser. No. 08/909,207.

Hales, U.S. Pat No. 4,694,255 has considered birdcage coils of as many as 32 legs, observing that the field uniformity is improved with the greater number of legs. However, Hales remarks that increasing the number of coil turns in an effort to increase homogeneity is not a viable solution since such increase would increase the inductance thereby limiting the resonant frequency and secondly, that reduction of open spaces between adjacent conductors would adversely effect the magnetic flux paths created by the current flow in the adjacent conductors.

BRIEF DESCRIPTION OF THE INVENTION

The present invention realizes a birdcage coil featuring a high density of legs thereby achieving increased B1 homogeneity and improved RF conductivity. A preferred arrangement includes disposing the legs on one, or both sides of a flexible substrate to be formed into an appropriate cylinder of desired cross section. Series capacitances for low pass coil legs are obtained from overlapping of leg portions. Where capacitive coupling between legs is required, such coupling is distributed over the length of the leg in the form of interdigitated whiskers from adjacent legs. Localized capacitive coupling at the ends of legs is obtained in a stepped arrangement that provides a discrete capacitive coupling between leg end portions without an annular conductor, thereby lessening the conductive materials sustaining eddy currents. The contribution to inductive reactance derives substantially from mutual inductance as the density of legs per azimuthal angular interval increases.

Further to the increased number of legs, the present invention can yield an improved filling factor due to the decreased requirement for chip capacitors which limit the volume available for sample.

BRIEF DESCRIPTION OF THE FIGURES

FIG. 3b is an unbalanced form of the coil of FIG. 3a.

DETAILED DESCRIPTION OF THE APPARATUS

The physical context of the invention is an NMR apparatus. An idealized illustration is shown in FIG. 1.

A magnet 10 having bore 11 provides a main magnetic field. In order to control the magnetic field with precision in time and direction, there are provided magnetic field gradient coils (not shown). These are driven by gradient power supplies 16, 18 and 20, respectively. Additionally, other shimming coils (not shown) and power supplies (not shown) may be required for compensating residual undesired spatial inhomogeneities in the basic magnetic field. An object for analysis (hereafter "sample") is placed within the magnetic field in bore 11 and the sample is subject to irradiation by rf power, such that the rf magnetic field is aligned in a desired orthogonal relationship with the magnetic field in the interior of bore 11. This is accomplished through a transmitter coil 12 in the interior of bore 11. Resonant signals are induced in a receiver coil, proximate the sample within bore 11. The transmitter and receiver coils may be the identical structure, or separate structures.

Figure 1:
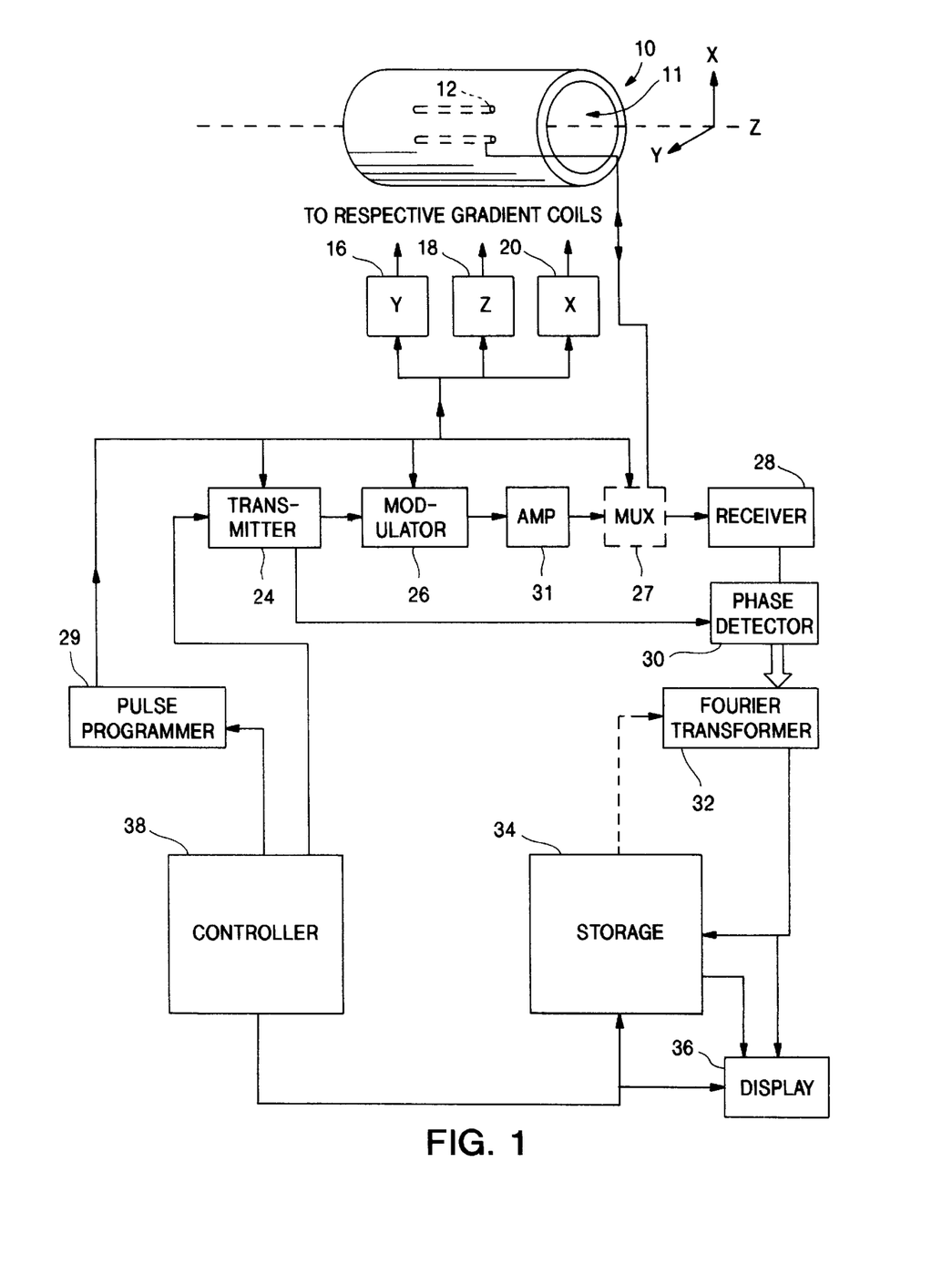
FIG. 1 illustrates the context of the invention.

As shown in FIG. 1, RF power is provided from first transmitter 24, and is amplified by an amplifier 31 and then directed via multiplexer 27 to the RF transmitter coil 12 located within the bore 11. The transmitter 24 may be modulated in amplitude or frequency or phase or combinations thereof, either upon generation or by a modulator 26. Additional transmitter identical to transmitter 24 and modulator identical to modulater 26 components are often employed to independently excite different gyromagnetic resonators, e.g., protons and $C^{13}$. These independent excitations are conveniently supported by a multiply resonant coil as described herein. Transmit and receive functions are not concurrently active. The identical coil may be employed for both functions if so desired. Thus, a multiplexer 27 is provided to isolate the receiver from the transmitter. In the case of separate transmitter and receiver coils, element 27, while not precisely a multiplexer, will perform a similar isolation function to control receiver operation.

The modulator 26 is controlled by pulse programmer 29 to provide rf pulses of desired amplitude, duration and phase relative to the rf carrier at preselected time intervals. The pulse programmer may have hardware and/or software attributes. The pulse programmer also controls the gradient power supplies 16, 18 and 20, if such gradients are required. These gradient power supplies may maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more computers, controls and correlates the operation of the entire apparatus.

The birdcage coil is a well known rf resonant structure for achieving a homogeneous rf field in which to immerse an object for study. The birdcage coil is effectively described as a ladder circuit or transmission line which closes on itself wherein the current flow around the circuit is distributed sinusoidally. The birdcage structure may be regarded as a periodic structure over which the rf phase shift (which must aggregate to $2\pi k$) is distributed. The birdcage resonator is most commonly realized in cylindrical geometry and is most commonly operated in the k=1 mode which produces a maximally uniform transverse field within the sample volume.

In adapting the birdcage coil to use in high resolution measurements within small bore magnets for operation at high frequencies, one encounters several constraints. The spatial limitations affect the assembly of a suitable coil using standard chip capacitors. The relatively small dimensions limit the achievable inductance of conventional birdcage coils which are simply scaled to desired dimensions. However, the total inductive reactance is recognized to be given by $$L_{total} = L_s + M$$

where $L_s$ is the self inductance of the conductors (principally, the legs) and M is the mutual inductance (of coupled loop elements comprising the birdcage coil). Accordingly, a birdcage design which would provide an increase in M could provide the required total inductance for given resonance conditions and geometric limitations. A large number of leg conductors increases the sum of the self inductances and the close spacing of the numerous legs provides a comparable, or even greater mutual inductance component. A large number of legs in a geometrically limited volume also constrains the provision of the required capacitances, and that problem is addressed in structures which furnish the required capacitance from interdigitated arrangements, or from overlapping conductor portions as shown and discussed herein. Accordingly, the present invention may be characterized by a large ratio of mutual inductance to total inductance.

Turning now to FIG. 2, there is shown a birdcage coil of the present invention which features a large number of legs arranged in birdcage fashion to produce a birdcage resonator. The relatively large number of legs of finite cross section (width $W_0 = R \Delta\theta$), arranged about the periphery of the cylinder of radius R require substantially minimal angular separation between adjacent legs. The self inductance of a conductor can be computed and the total self inductance summed. Mutual inductance may be approximated by various computational techniques which most commonly assume a filamentary model, e.g., conductors of negligible cross section. Experimentally, the mutual inductance M for a birdcage coil of the present invention can be measured from the measured resonant frequency and the computed capacitance as discussed below. The approximate mutual inductance associated with a pair of parallel filaments of length h, separated by a gaps is given by Terrnan, "Radio Engineers Handbook", P.65, McGraw-Hill Book Company (1943):

$$M = a\ h\ [b\ \log\ (2h/s) - 1 + (h/s)],$$

where a and b are constants. This relationship is given more precisely, by Grover, "Inductance Calculations: Working Formulas and Tables", Dover, N.Y. 1962, as $$M = 0.002\ h\ [\ \ln(h/s + (1+(h/s)^2)^{1/2}) - (1+(s/h)^2)^{1/2} + s/h\ ] \qquad \text{Equ. 1}$$

Such calculations are an idealized, or conventional model, providing only a gross estimate of the mutual inductance when the density of the legs becomes "sufficiently" large, as will be discussed below. As the separation of adjacent legs decreases, the mutual inductance increases. One attribute of the density of legs associated with a birdcage structure of selected radius is "large" whenever the mutual inductive contribution to the total inductance of the birdcage resonator exceeds 45% as computed from conventional model calculations using the standard software referenced below. Alternatively, the coil of the present invention can be said to exhibit leg element cross section which is not negligible in relation to the separation of adjacent said legs. The resulting coil is known as a "Millipede" birdcage coil by virtue of its density of legs and the large proportion of inductive reactance realized from mutual inductance. (The terminology is intended to be inclusive of "centipede" coils.) This characterization is a convenient quantitative property, but need not be regarded as the exclusive characterizing property for the coil structures of the present invention. For convenience, birdcage coils which by the reference to the aforementioned computational software, realize more than 55% of their required inductive reactance from self inductance (by filamentary model calculation), will be regarded as "conventional" birdcage coils.

Mutual inductance is a property of coupled circuit loops. A single conductor possesses self inductance. In the present discussion, a birdcage coil having leg elements A, B, C and D may present loops comprising legs AB, BC, CD, and DA. Larger loops AC and CA may be identified, and so on. The coupling of various loops contributes to the mutual inductance of the birdcage structure. Analytic treatment of birdcage coils has been treated in the literature. See for example, Lifer, J. Mag. Reds. v.124, p.51–60 (1997). For present purposes, calculations of the inductance of birdcage coils, including mutual inductance, have been carried out using the work of C. L. Chin, MS thesis, Bioengineering Program, Pennsylvania State University; principally embodied in the software, Birdcage Builder Version 1.0, Center for NMR Research, Penn State College of Medicine, Department of Radiology, Hershey, Pa. 17033. These references assume the filamentary model for calculation of mutual inductance. Although an approximation, this provides a useful quantitative tool for comparison of different birdcage designs including the prior art and gross aspects of the present invention. It must be born in mind that the Lifer and Chin references and the referenced software, assume that the inductive members can each be represented by a filament, e.g., a current distribution having negligible extension transverse to the current flow, and that the mutual inductance is attributed to nearest neighbor pairs of current carriers. In particular, the present invention is directed to birdcage coils characterized by a relative high density of legs and wherein adjacent leg elements may have separations, in relation to which, the transverse dimensions of the leg element is not negligible. At the frequencies of interest herein, RF current flow is largely confined to the surface of the leg element further complicating any analytic treatment of coupling between adjacent leg elements where the cross section of the leg element is not negligible in relation to the leg element separation. The result of the dense disposition of leg elements in the current invention, is to produce a birdcage coil exhibiting unusually high inductance, principally because of the significant contribution of the mutual inductance, which is not obtained in the prior art. One characterizing aspect of the present invention is that the cross sectional dimensions of the leg members are not negligible in relation to the separation of adjacent leg elements. To give this observation a more operative form, this condition is taken to mean that the model expression provided by references relying upon a filamentary model would be consistently erroneous to a substantial degree in accounting for the inductance of the resonator when applied to the Millipede coils of the present invention.

Figure 2A:
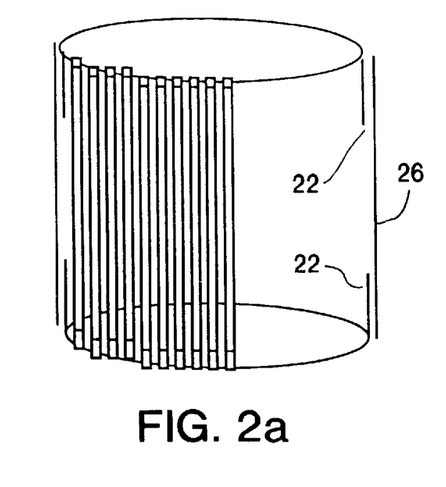
FIG. 2a shows a balanced low pass birdcage coil of the present invention.

FIG. 2a shows a balanced low pass birdcage coil of the present invention. The peripheral interval ($R\Delta\theta$) subtended by a pair of legs is selected for implementing selected capacitances and inductances. The minimum conductor width is limited in principal by the customary limits of lithographic techniques. The interval between legs is very small. The low pass balanced character of the coil is apparent in the series capacitors 22 shown for an exemplary leg 26 which is implemented on opposite sides of a substrate (not shown). The B1 homogeneity is increased as the number of legs increases as expected. However, as mentioned above, the increased number of chip capacitors would pose a barrier to increase of the number of legs as the radius of the coil approaches N× lateral dimension of such a capacitor.

Figure 2B:
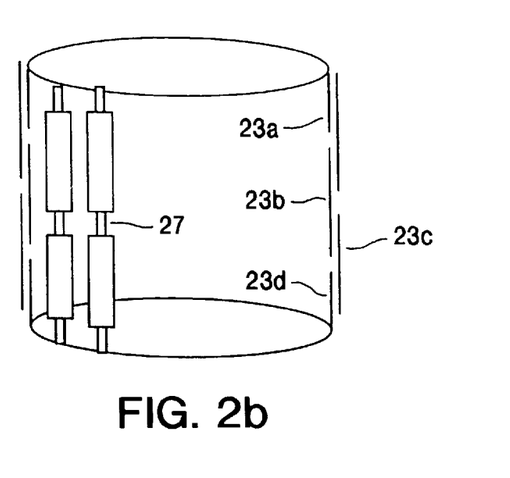
FIG. 2b shows a variation of FIG. 1 including series capacitors in each leg.
Figure 2C:
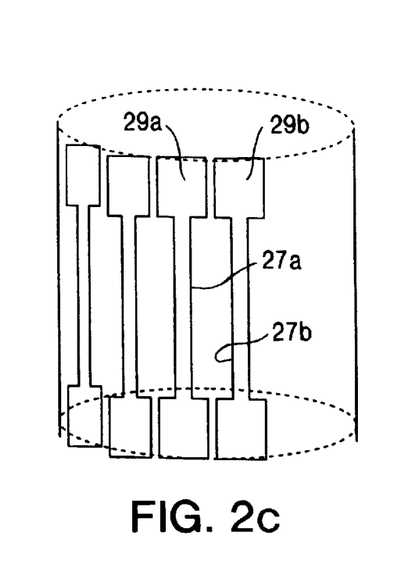
FIG. 2c shows a high pass birdcage coil of the present invention.

As the number of legs increases for fixed radial dimension, the effective inductance is increased and the indicated capacitance required for the designed resonant frequency becomes small. This is achieved with series capacitors for each leg. FIG. 2b shows a variation of the coil of FIG. 2a wherein the leg conductor 27 comprises, by way of example, four series capacitances 23a, 23b, 23c, and 23d constructed by overlayment of portions of the leg conductor 27 on opposite surfaces of a substrate, not shown.

Where a high pass birdcage coil is desired, the embodiment of FIG. 2c provides an arrangement without an explicit end ring conductor. The adjacent legs 27a and 27b couple capacitively, especially as may be controlled through the design of the end portions thereof The design may be implemented directly upon a flexible substrate. This general approach is directly facilitated by the annular density of legs which provides for the range of capacitive coupling.

Figure 2D:
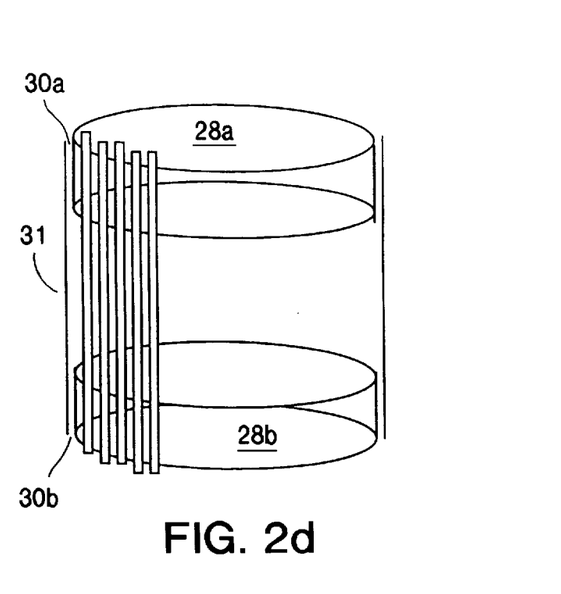
FIG. 2d shows a birdcage coil where high capacitance is realized in conjunction with end ring conductors.

In particular for small to medium bore magnets (10 mm to 40 mm), as noted previously, the spatial limitation is a limitation on inductance for the prior art. As a consequence, the larger numbers of capacitors are limited by spatial constraints. As a practical matter, the chip capacitors are almost certainly not susceptibility compensated for high resolution measurements. FIG. 2d shows an embodiment wherein end rings 28a and 28b disposed on opposite sides of the substrate and provide the necessary capacitances 30a and 30b in conjunction with the legs 31 disposed on the opposite side of the substrate (not shown). In order to design the requisite capacitance, the axial length of the end rings 28a and 28b may be extended, thus increasing the overlap area for the respective elements.

Figure 2E:
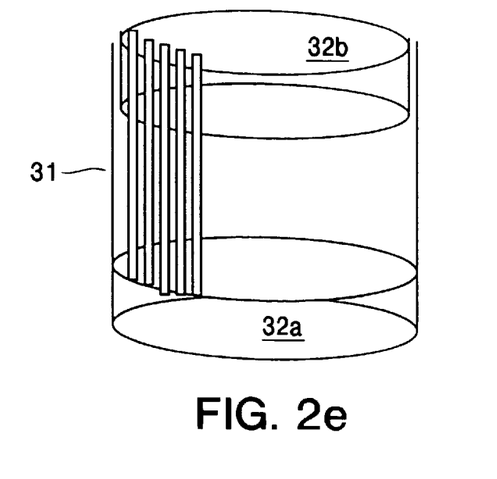
FIG. 2e is a variation of FIG. 2d for an unbalanced design.

In some applications an unbalanced design may be desired, especially where the tuning range is large. FIG. 2e is a straightforward variation of the design of FIG. 2d wherein the capacitance is increased by a factor of two by elimination of the coupling capacitance of legs 31 to the end rings 32a and 32b.

Figure 3A:
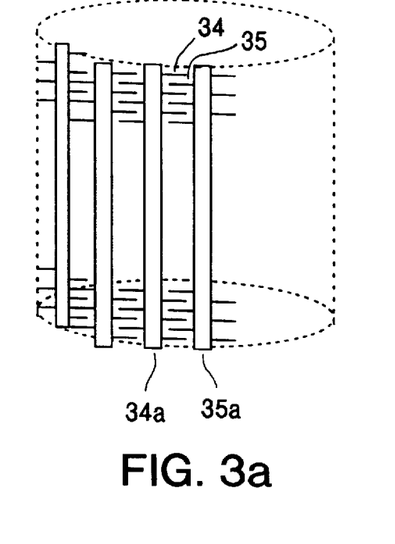
FIG. 3a shows a high pass Millipede coil with distributed capacitance.
Figure 3B:
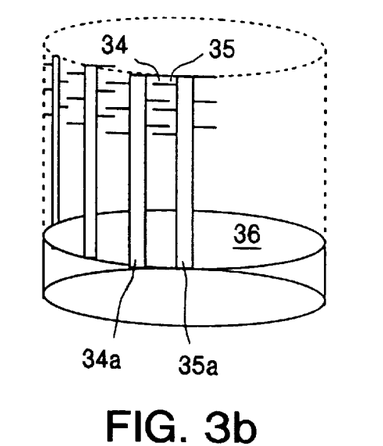
Figure 3C:
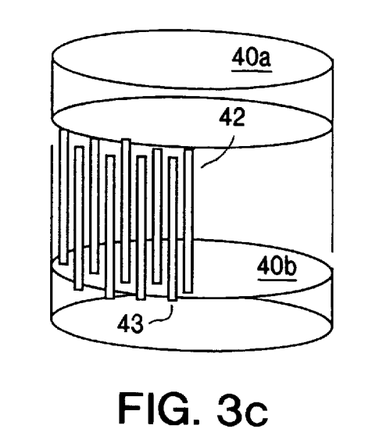
FIG. 3c shows an example of axially interdigitated capacitance distributed over legs.

FIGS. 3a and 3b show an arrangement for a high pass Millipede coil wherein the inter-leg capacitance is distributed over the axial length of the leg through an inter-digitated design achieved by non-contacting overlapping adjacent whiskers 34 and 35 extending from legs 34a and 35a respectively. FIG. 3a is a balanced, and FIG. 3b, the unbalanced coil. The unbalanced coil FIG. 3b has a single end ring 36 coupling legs 34a and 35a. The interdigitated capacitance is limited by the achievable trace widths, which may be of the order of a few mils for typical lithographic techniques on flexible substrates. On rigid cylinders, state of the art techniques permit spatial resolution limited by the thickness of the conductor, e.g., in the range from about 1.4 to 0.7 mil. Features as small as 5 mil have been achieved and 2 mil can be obtained with great care. As a practical matter, the resolution limit is of the order of a few mils for the flexible substrate type of coil construction. For coils intended for use in small bore magnets (in the range of about 3mm to about 10 mm coil diameter) an axially interdigitated structure may be desirable, such as shown in FIG. 3c. In this structure, leg 43 coupled to ring 40b interleaves with leg 42 coupled to ring 40a. In typical usage these small coils are employed at high magnetic field and the resonance frequency is rather high. Accordingly, there is a requirement for high capacitance which is in turn a function of the gap between capacitor electrodes. This gap is, as noted above, reliably achievable by modern techniques to resolutions on the order of mils for common printed circuit techniques.

Figure 4A:
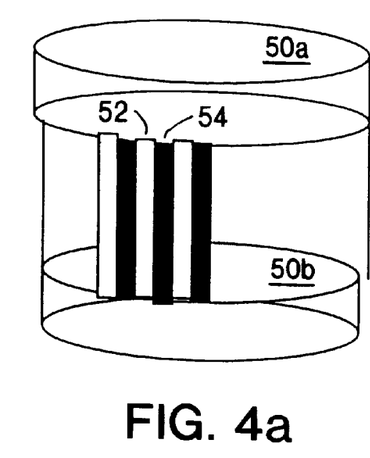
FIG. 4a is a coil formed from coaxial faraday shields.
Figure 4B:
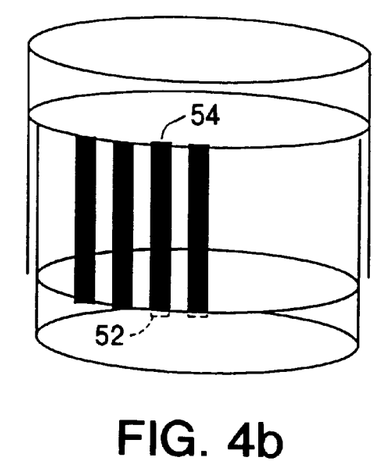
FIG. 4b is a variation of FIG. 4a wherein relative angular displacement of the shields is shown.

The structures described here bear a resemblance to the well known Faraday shield. FIG. 4a describes an arrangement of two coaxial such Millipede structures on slightly different diameters corresponding to the two opposite surfaces of a cylindrical substrate. The angular gap(s) between the leg(s) 52 of the outer Millipede coil including end ring 50a is occupied by the angular extent of the leg(s) 54 of the inner Millipede coil including end ring 50b. Distributed capacitances are obtained between the inner and outer respective legs. There is also obtained a contribution to $B_0$ homogeneity in the resulting cylindrical shell symmetry of the finite susceptibility of the leg elements. In FIG. 4b the need for greater capacitance is satisfied by relative angular displacement of inner and outer patterns defining the corresponding legs. In FIG. 4b the relative angular displacement is such as to provide maximum overlap wherein outer coil legs 52 exactly overlap inner legs 54. For that choice of angular displacement the $B_0$ homogeneity is perturbed at some high order. As the density of elements increases, this high order perturbation increases to still higher order as the assembly of legs approaches a continuous surface.

Figure 4C:
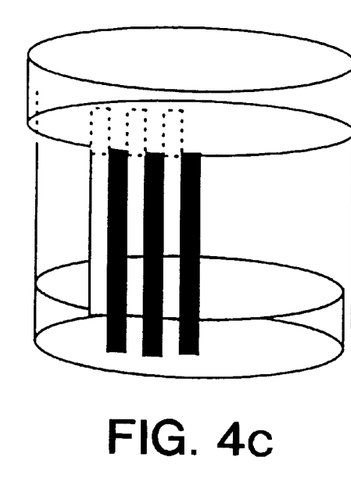
FIG. 4c provides for arc protection for faraday shield type coils.

FIG. 4c is similar to FIGS. 4a and 4b with the additional feature that the legs of the respective inner and outer structures extend beyond the opposite end ring to overlap same. The result of this structure is to reduce the risk of arcing. This is especially useful for decoupling usage where high power is customarily applied.

Figure 5:
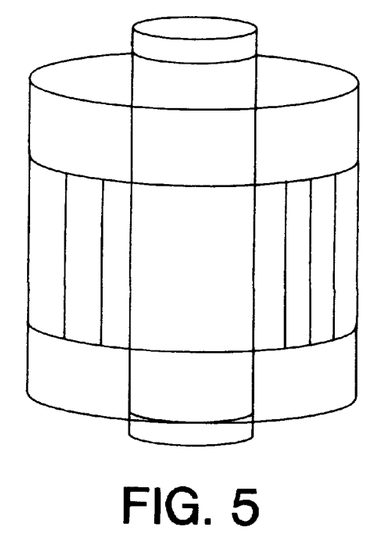
FIG. 5 shows a coaxial pair of birdcage coils for a double tuned application.

In another embodiment, shown in FIG. 5 a coaxial pair of birdcage coils are used for a double tuned application. Multiple tuned structures may include a coaxial birdcage coil a Millipede coil as presented in FIGS. 2a–2e, 3a–3c, or 4a–4c, preferably a conventional birdcage coil surrounds an inner Millipede coil. In prior art, coaxial saddle coils were oriented in orthogonal fashion for the purpose of quadrature detection. A representative structure was discussed by Fitzsimmons and Beck, Abstr. Of SMRM, $9^{th}$ Ann. Mtg., p.532, 1990, for obtaining concurrent proton and phosporous resonance signals. In the present work, a coaxial pair of birdcage coils have been constructed and studied wherein the outer coil of 10 mm. diameter was a conventional low pass birdcage design having 8 leg elements. The inner coil was a Millipede coil having 34 legs disposed on a diameter of 5.5 mm. Outer and inner coils were tuned to resonance at 78 and 502 MHz respectively.

In order to demonstrate a quantitative context for the concept of Millipede coils, calculations have been performed for a number of design parameters for a low pass Millipede coil resonant at 200 MHz. For the number of legs, the electrical parameters are calculated with the resulting computed self-inductance, total inductance and the separately computed mutual inductance for the coil. The calculations were carried out with the aid of that above referenced software entitled "Birdcage Builder". These computational results are shown in table 1 for a low pass unshielded birdcage coil resonant at 200 Mhz. In each case the length of the coil is equal to the diameter. As indicated above, the calculation of mutual inductance is based on a filamentary model of nearest neighbor interactions.

TABLE 1

| Diameter cm | Legs | Capacitance pF | $L_{self}$ nH | $L_{mutual}$ nH | $L_{total}$ nH | $L_{mutual}/L_{total}$ |
|---|---|---|---|---|---|---|
| 20 | 32 | 0.54 | 168.4 | 285.9 | 454.3 | 0.630 |
|  | 28 | 0.61 | 168.4 | 236 | 404.45 | 0.588 |
|  | 24 | 0.70 | 168.4 | 187 | 355.44 | 0.526 |
|  | 20 | 0.83 | 168.4 | 139.16 | 307.52 | 0.392 |
|  | 16 | 1.00 | 168.4 | 92.81 | 261.17 | 0.354 |
|  | 12 | 1.26 | 168.4 | 48.96 | 217.3 | 0.225 |
|  | 8 | 1.68 | 168.4 | 9.57 | 177.93 | 0.054 |

TABLE 1-continued

| Diameter cm | Legs | Capacitance pF | $L_{self}$ nH | $L_{mutual}$ nH | $L_{total}$ nH | $L_{mutual}/L_{total}$ |
|---|---|---|---|---|---|---|
| 10 | 32 | 1.22 | 84.18 | 143 | 227.13 | 0.630 |
|  | 28 | 1.38 | 84.18 | 118.0 | 202.22 | 0.584 |
|  | 24 | 1.59 | 84.18 | 93.58 | 177.72 | 0.527 |
|  | 20 | 1.87 | 84.18 | 69.62 | 153.76 | 0.453 |
|  | 16 | 2.26 | 84.18 | 46.45 | 130.59 | 0.356 |
|  | 12 | 2.83 | 84.18 | 26.51 | 108.65 | 0.244 |
|  | 8 | 3.74 | 84.18 | 4.83 | 88.97 | 0.054 |
| 2.5 | 32 | 6.72 | 21.03 | 35.73 | 56.76 | 0.629 |
|  | 28 | 7.58 | 21.03 | 29.51 | 50.54 | 0.584 |
|  | 24 | 8.68 | 21.03 | 23.38 | 44.41 | 0.526 |
|  | 20 | 10.14 | 21.03 | 17.38 | 38.42 | 0.391 |
|  | 16 | 12.13 | 21.03 | 11.6 | 32.63 | 0.356 |
|  | 12 | 14.98 | 21.03 | 6.11 | 27.14 | 0.225 |
|  | 8 | 19.18 | 21.03 | 1.19 | 22.22 | 0.054 |
| 0.5 | 32 | 59.76 | 4.19 | 7.15 | 11.34 | 0.631 |
|  | 28 | 75.52 | 4.19 | 4.68 | 8.87 | 0.528 |
|  | 28 | 66.79 | 4.19 | 5.9 | 10.09 | 0.585 |
|  | 20 | 86.60 | 4.19 | 3.48 | 7.67 | 0.356 |
|  | 16 | 100.92 | 4.19 | 2.32 | 6.51 | 0.226 |
|  | 12 | 119.92 | 4.19 | 1.22 | 5.41 | 0.054 |
|  | 8 | 142.95 | 4.19 | 0.24 | 4.43 |  |

One might observe that the equality of the mutual inductance with self inductance occurs between 20 and 24 legs for all of these design sets. However, the number of legs is not the critical defining aspect. It is. the very substantial contribution of the mutual inductance to the total inductance of the coil which characterizes the Millipede coil. For the cases of table 1, the coil radii are relatively small and a substantial annular density of legs is obtained to establish that even a model calculation suggests that advantages may be achieved for a dense aggregation of birdcage coil elements.

To place the calculations of table 1 in the context of the prior art, several of the small bore coils of the prior art described by Cozier, et al were calculated in identical fashion and these results are shown in table 2

TABLE 2

| Reference identifier | legs | diameter* Cm. | reson. F MHz | capacitance per leg (pf) | Ls nh | $L_T$ nh | $L_s/L_T$ |
|---|---|---|---|---|---|---|---|
| #1 | 8 | 6.4 | 300 |  | 57.74 | 61.27 | 0.94 |
| #11 | 8 | 1.5 | 300 | 39 | 13.1 | 14.0 | 0.93 |
| #10 | 8 | 20 | 300 | 29.5 | 17.6 | 18.7 | 0.94 |
| #9 | 12 | 6.4 | 200 | 28.98 | 65.0 | 88.6 | 0.73 |
| #4 | 16 | 6.4 | 300 | 16.5 | 70.2 | 116.0 | 0.6 |

*coil length = 1.4 × diameter

The prior art coils of Cozier et al, contain a mutual inductive contribution of 40%, at most, of the total inductance. As shown in table 1, example coils of the present invention may produce mutual inductances which are multiples of the self inductance, even on the basis of simple approximation.

Millipede coils according to the present invention have been built and tested. It is convenient to compare the present invention with prior art as represented by the above referenced software. For this purpose, consider an actual Millipede coil having the following specifications:

| Coil radius | 1.6 cm. |
|---|---|
| Coil length | 4.3 cm |

-continued

| Number of elements | 395 |
|---|---|
| Element width | 0.127 mm |
| Inter-element gap | 0.127 mm |
| End ring width | 2 mm |
| RF shield radius | 2 cm. |
| Observed resonant frequency | 300 MHz |

Next, consider a 32 element conventional birdcage coil, having the same ratio of element width to inter-element gap. It is an assumption of prior art that the resonant frequency of a birdcage coil is independent of the number of legs. The same element width to gap ratio in combination with this assumption should yield a coil of quite identical properties. For example, the self inductance which depends on element length and width will be identical with the equivalent Millipede coil. Computing the capacitance associated with this coil structure is $$C = \epsilon \epsilon_0 A/d$$

where d is the thickness of the substrate interspersed between elements and the ground plane, A is the element area $\epsilon$ and $\epsilon$ and have their usual meanings. For the present case $$d = 1.27 \times 10^{-4} \text{ M}$$

$$A = 1.57 \times 10^{-3} \text{ M}^2$$

$$\epsilon = 8.9 \times 10^{-12} \text{ UNITS}$$

$$\epsilon = 2.2 \text{ (Duroid ® 5880 substrate)}$$

from which one obtains capacitance per element $$C \sim 0.48 \text{ pF.}$$

Utilizing the same physical specifications for a conventional 32 element birdcage coil, the reference software yields capacitance per element $$C \sim 1.77 \text{ pF.}$$

e.g., about 3 times greater capacitance for the required 300 MHz resonance. The reference software also yields $$L_s = 29 \text{ nH}$$

$$L_m = 12 \text{ nH.}$$

In the present instance the observed 300.0 mHz resonance for the 395 element coil confirms that the total inductance of the actual coil is greater than the above computed $L_s + L_m$, following which the mutual inductance must be significantly greater. This is consistent with the greater density of leg elements and could be indicative of non-negligible effects of the finite cross section of the leg conductors in relation to the inter-element gap. Thus a Millipede coil is characterized by a density of leg elements sufficient to contribute greater mutual inductance for the coil in comparison with prior art. The assumption of the prior art, that the resonant frequency was independent of the number of legs, is not justified as the number of interacting conductors contributes a greater proportion of mutual inductance to the total inductance of the coil.

Figure 6:
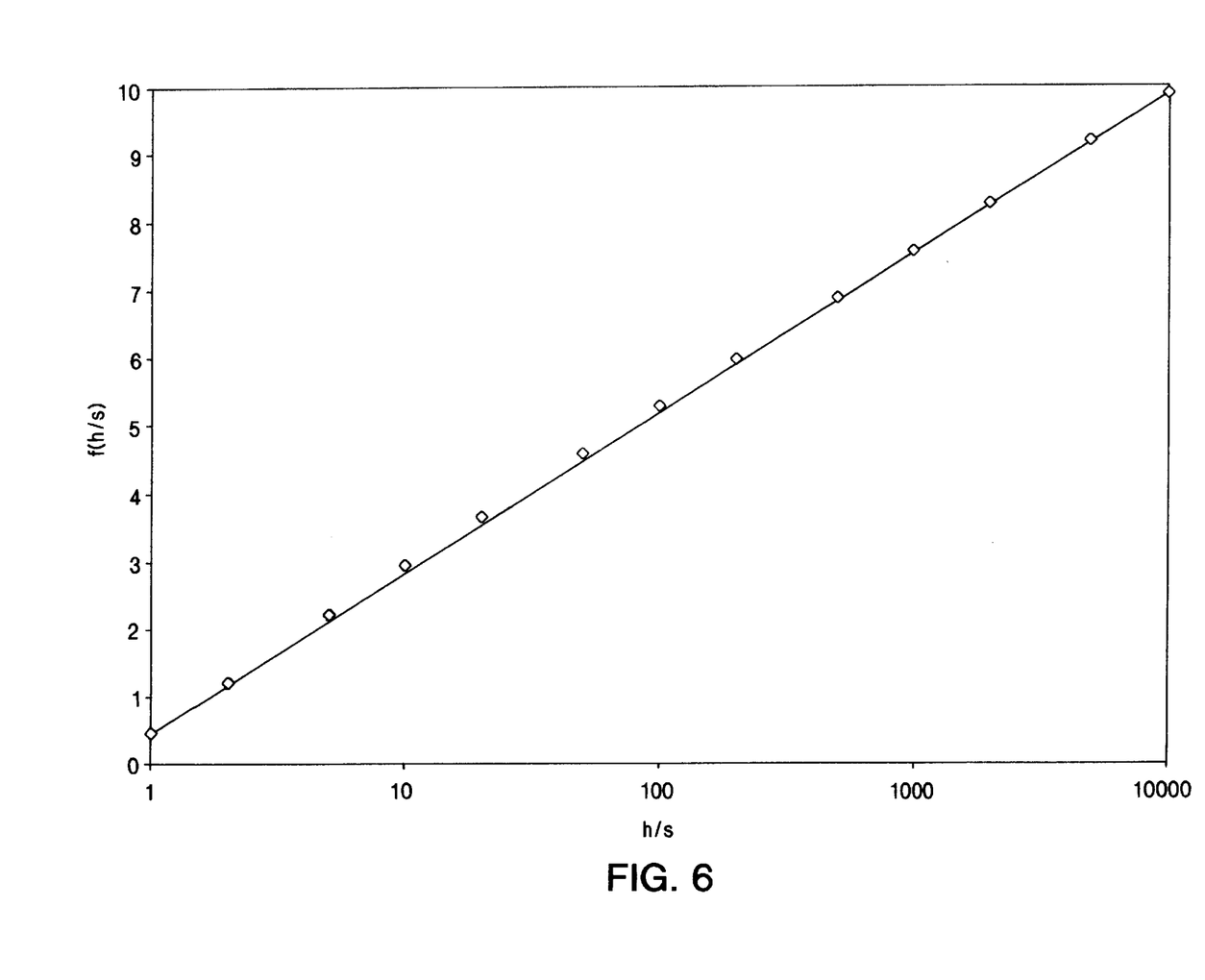
FIG. 6 is a plot of the function defined by equation 1.

FIG. 6 represents equation 1 which is a model calculation of the mutual inductance obtaining between two parallel filamentary conductors of length h and separation s as a function of h/s. Birdcage coils known to the inventor contribute to the total inductance primarily through the self inductance which depends upon the length h and width w of a rectangular leg conductor through the relation $$L_s = 0.002\, h\, [1n(2h/(X+Y)) + \tfrac{1}{2} - 1n\, D]  \qquad \text{Equ.2}$$

where X and Y are the transverse dimensions to the length, h, and D is a function of X/Y which is close to zero for a thin strip conductor. In cases of interest, the width w, e.g. X, is such that w and s are similar, that is, w/s is in the approximate range 0.4<w/s<4, while h/w and h/s are each typically of the order of about10 and preferably $10^2$.

The Millipede coil is characterized, in part, by a sufficient density of leg elements with the consequence that the mutual inductance contributes approximately the same magnitude to the total inductance as does the self inductance of the birdcage elements. A functional concept of density for this purpose is to be found in the interaction of legs from which arises the mutual inductance. A pair of adjacent leg conductors contribute both self inductances and mutual inductance as $$L_s^{(1)} + L_s^{(2)} + M_{1,2}$$

This takes account only of the nearest neighbor interaction of legs 1 and 2. A "sufficient" density of legs must take account of the coupling beyond nearest neighbor pairs. Taking consideration of at least the next nearest neighbor interactions, the contribution to the total inductance is $$L_s^{(I)} + L_s^{(2)} + L_s^{(3)} + M_{1,2} + M_{2,3} + M_{1,3,}$$

where the indices refer to the labeled legs. The spacing between each of the three legs is s and the between legs 1 and 3 the spacing is taken as 2s+w where w is the finite width of the intermediate leg.
Clearly $M_{1,3} < M_{1,2}$. "Sufficient" density obtains, where $$(M_{1,3}/M_{1,2}) > \rho P_0$$

and $\rho_0$ is taken (arbitrarily) to be 0.3.

There is a tendency of prior art to reduce the interaction of adjacent leg conductors in order to increase the Q of the resulting birdcage structure. An extreme example is evident in the work of Vaughan et al, MRM, v.32, pp. 206–218 (1994). Millipede/Centipede coils of the present invention exhibit enhanced coupling of elements. The mutual inductance contribution depends upon a logarithmic function of 1/s. For sufficiently small values of separation, s, the actual mutual inductance is expected to depart from the plotted function to exhibit greater values than the filamentary model of FIG. 6 produces. Again, the assumption of the prior art with respect to the independence of the resonant frequency on the number of legs, also fails to reflect the importance of a dense distribution of leg elements.

Figure 7A:
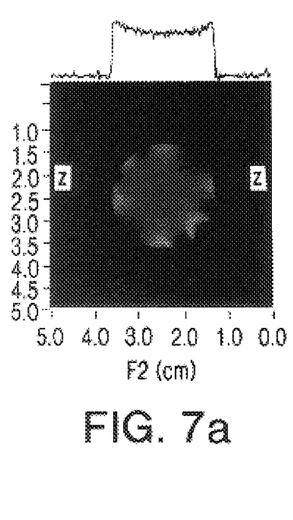
FIG. 7a shows a proton image of a cross section of a cylindrical phantom taken on a diameter of a low pass prior art saddle coil. of FIG. 4a geometry.
Figure 7B:
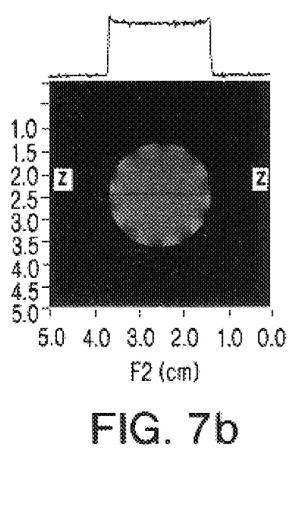
FIG. 7b shows a proton image of a cross section of a cylindrical phantom taken on a diameter of a low pass birdcage coil of conventional design.
Figure 7C:
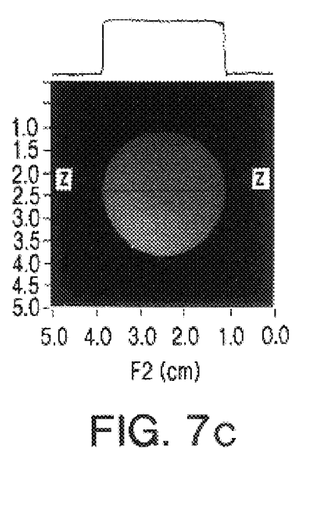
FIG. 7c shows a proton image of selected cross sections of a cylindrical phantom taken on a diameter of a low pass Millipede coil of FIG. 4a geometry.

FIGS. 7a through 7c, respectively, compare images (slices) taken on the diameter along a tubular mineral oil phantom on the axis of coils of saddle geometry (FIG. 7a,) of conventional birdcage geometry (FIG. 7b) and a Millipede coil of the present invention. The saddle coil of FIG. 7a is of conventional structure as described in U.S. Pat. No. 4,517,516 to Hill and Zens and measures about 25 mm×25 mm long. The evident inhomogeneities along the periphery and extending into the interior region of the image are a consequence of the saddle coil conductors. The conventional birdcage coil of FIG. 7b is a 12 element coil of similar dimensions to the coil of FIG. 7a. Both images 7a and 7b are acquired from a single 90° excitation. The image of FIG. 7b *shows the presence along the periphery of the* 12 legs of the coil. The Millipede coil of FIG. 7c is formed on a cylinder of 30 mm (I.D.)×40 mm in length. The coil comprised 395 legs, equally spaced on the circumference, each leg formed of a trace of width 0.005". This coil follows the geometry of FIG. 4a wherein series capacitances are formed by axial overlap of leg portions on opposite sides of the cylindrical substrate. The $B_1$ homogeneity is clearly greatly improved by reference both to the image and the profile taken on the indicated diameter ZZ. In acquiring this image, a fast spin-echo sequence was employed of 64 π, thus providing for the accumulation of signal imperfection which would tend to enhance any inhomogeneity. For this particular Millipede coil, the ratio $L_{self}/L_{total} < 0.1$. The Q measured for this coil (unloaded) is approximately 300.

There are other aspects to the invention in general, which contribute to its particular utility for magnetic resonance measurements. The increased density of legs has the effect of providing a Faraday shield type structure around the sample, thereby reducing the RF electric field at the sample. Sample heating is reduced, as is the frequency shift. The improved $B_1$ homogeneity has the effect that the coil can be disposed in closer proximity to the sample without sacrifice in homogeneity, yielding an increased filling factor. The RF current is divided and distributed over many legs with the result that RF conductivity is increased, in analogy with the well known Litz wire concept. A further result of this division of RF current is the reduction in local heating. Because of the distributed capacitance which is a feature of the various Millipede coil structures herein, there is no high voltage point, thereby reducing the likelihood of voltage breakdown.

The improved $B_1$ homogeneity resulting from the Millipede coil structure is evident from data such as FIG. 6c. Note that improved homogeneity in $B_0$ is also obtained because the magnetic susceptibility property of the legs is distributed symmetrically and uniformly over a cylindrical shell.

Figure 8A:
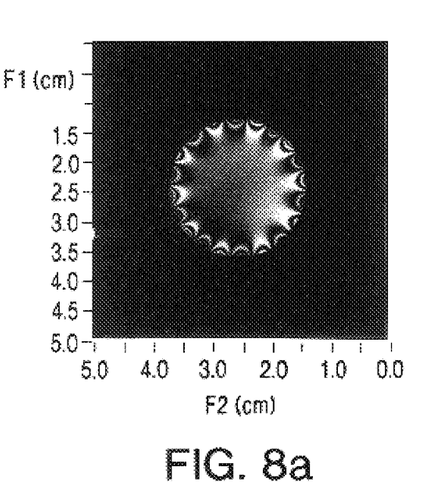
FIG. 8a shows a proton image of a conventional 12 leg birdcage coil using a 24.5π excitation pulse.
Figure 8B:
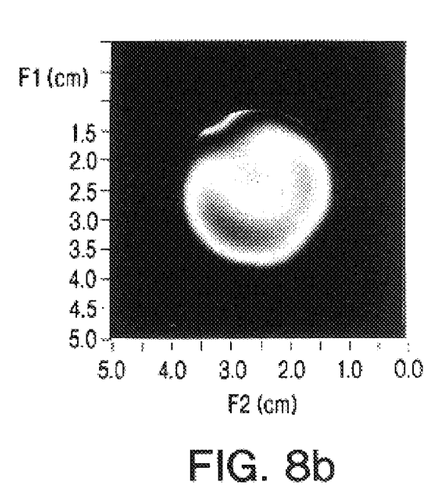
FIG. 8b is a proton image of a Millipede coil using a 24.5π excitation pulse.

An even more rigorous comparison of homogeneity properties of a conventional 12 leg birdcage coil and a Millipede coil of comparable dimension are shown in FIGS. 8a and 8b, respectively. These images of a mineral oil phantom were obtained with 24.5π excitation pulses. As a result, the space between each dark band represents a variation of 90° in pulse flip angle and the dark bands may be regarded as contours of approximately constant 90° flip angle. Portions of a single contour appear on the Millipede coil example and these exhibit an asymmetry due to manufacturing defect which is observable at this level of detail. The greater region of acceptable homogeneity is evident in the case of the Millipede coil.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. A millipede magnetic resonance bird cage coil for providing a substantially uniform RF field in the cylindrical interior space thereof and exhibiting a total inductance $L_{total}$, comprising:

a number N of mutually isolated leg conductors disposed spaced by a distance R from an axis and principally extending parallel therewith, said plurality of leg conductors defining an active volume, each said leg conductor comprising a self-inductive reactance, $L_{self}$, and further comprising a mutual inductive reactance, M, said number N in relation to R, such that $(N\, L_{self})/L_{total} < 0.55$.

2. The bird cage coil of claim 1 wherein said leg exhibits a greater dimension w, orthogonal to said axis at end portions thereof, whereby adjacent said end portions are capacitively coupled to a selected degree.

3. The bird cage coil of claim 1 wherein said legs are disposed as overlapping portions on opposite sides of a flexible dielectric substrate whereby series capacitive coupling between said portions is achieved.

4. The bird cage coil of claim 1 wherein each said leg is disposed on a first side of a flexible dielectric substrate and at least one annular conductor is disposed about said axis and overlapping an end portion of said leg on the opposite side of said substrate, whereby the capacitive coupling between all said legs may be adjusted by trimming said overlapping portion.

5. The bird cage coil of claim 1 wherein each said leg has a width W and each said leg further comprises a plurality of conductive whiskers protruding from each side of said leg toward an adjacent leg without contacting said adjacent leg, corresponding said whiskers from said leg and said adjacent leg being offset in the axial direction by a selected interval and forming a portion of an interdigitated structure.

6. The bird cage coil of claim 1 further comprising a first annular conductor disposed about said axis at the proximal end region of said legs and electrically coupled to alternate said leg conductors forming a first set of leg conductors, and a second annular conductor disposed about said axis at the distal end region of said legs and electrically coupled to a second set of leg conductors, said second set comprising leg conductors each adjacent said first set.

7. A nuclear magnetic resonance probe for analysis of a sample, comprising
   a sample holding fixture for receiving samples, and
   a Millipede coil disposed to surround said sample, said Millipede coil characterized by self inductance comprising less than 55% of the total inductance of said Millipede coil.

8. A magnetic resonance apparatus for excitation and detection of magnetic resonance phenomena in an object, comprising
   a magnet for establishing a magnetic field of desired properties over a volume containing said object,
   an RF source for exciting magnetic resonance phenomena in said object in combination with said magnetic field,
   an RF receiver for detecting magnetic resonance phenomena in said object, and
   a Millipede coil characterized by self inductance comprising less than 55% of the total inductance of said millipede coil for coupling said object to either said RF source or said RF receiver.

9. A method of establishing capacitive coupling between inductive elements of a millipede magnetic resonance birdcage coil having a plurality of inductive leg elements, comprising the steps of directing an auxiliary conducting member connected to one said inductive leg elements at an angle therewith and directed toward an adjacent said leg element without contact thereto, also directing an auxilliary conducting member connected to said adjacent said leg element toward said one said inductive leg element without contact therewith, establishing the relative displacement of said auxilliary conducting members to establish a desired capacitive coupling therebetween.

10. The method of claim 9 wherein the number of said auxiliary conducting members is adjusted to produce desired total capacitance for coupling of said legs.

11. A millipede magnetic resonance bird cage coil for providing a substantially uniform RF field in the cylindrical interior space thereof and exhibiting a total inductance $L_{total}$, comprising:
   a number N of mutually isolated leg conductors disposed spaced from an axis and surrounding said axis and principally extending parallel therewith, each said leg conductor of width w, said plurality of leg conductors defining an active volume, each said leg conductor comprising a self-inductive reactance, $L_{self}$, and pairs of said leg conductors $L^{(j)}$ and $L^{(k)}$ separated by an inter-element gap coupling to contribute an increment of mutual inductance $M_{j,k}$ wherein $$(M_{jj+2} / M_{jj+}) > 0.3.$$

12. A multiply resonant magnetic resonance coil structure comprising at least two coaxially disposed birdcage coils, a first said birdcage coil comprising a Millipede coil of outside diameter $D_1$ and exhibiting capacitive and inductive reactances for producing resonance at frequency $\omega_1$, a second birdcage coil of conventional construction having an inside diameter $D_2$ and exhibiting capacitive and inductive reactances for producing resonance at frequency $\omega_2$, where $D_2 > D_1$.

13. The multiple resonant coil structure of claim 12 wherein $\omega_2 < \omega_1$.

14. A millipede magnetic resonance bird cage coil comprising a plurality of leg elements disposed about and spaced from an axis, whereby a desired RF phase relationship is established among said leg elements, a first plurality of said elements coupled to a first end ring, a second plurality of said leg elements connected to a second end ring, a first plurality of leg elements comprising at least one leg of said first plurality comprising an auxiliary conductor directed toward a leg of said second plurality without contact therewith, a second plurality comprising at least one leg element proximate said leg element of said first plurality and said one leg element further comprises an auxiliary conducting member directed toward said one element of said first plurality without contact therewith whereby said auxiliary conductors comprise a capacitive coupling component between said respective legs.

15. The birdcage coil of claim 14 wherein at least selected legs of said first and second pluralities each comprise a plurality of auxiliary conductors whereby capacitive coupling components between adjacent legs are axially distributed.

16. The birdcage coil of claim 15 wherein said first and second pluralities are disposed on the same surface of a substrate.

17. The millipede magnetic resonance birdcage coil of claim 15 wherein said first end ring with the first plurality and the second end ring with the second plurality are disposed, respectively, on the opposite surfaces of a substrate.

18. A millipede magnetic resonance bird cage coil for providing a substantially uniform RF field in the cylindrical interior space thereof, comprising:
   a plurality of leg conductors disposed spaced from an axis and parallel therewith, said plurality of leg conductors defining an active volume, each said leg conductor comprising a substantially planar and extended member comprising a dielectric core having conductive surfaces on opposite substantially planar sides thereof, a first conductive surface disposed facing said interior space and a second conductive surface having at least an inner conductive portion removed from said substrate, said inner conductive portion distal in respect to end regions of said extended member, and end portions removed from said first conductive surface whereby said first and second surfaces are not co-extensive in said end regions;
   a pair of annular conductors disposed about said axis and coupled to adjacent said leg conductors at respective ends thereof;
   pairs of said leg conductors separated by an inter-element gaps, the mutual inductance of the birdcage coil is greater than the self inductance of the legs of said coil.

* * * * *